United States Patent [19]

Nakazawa et al.

[11] Patent Number: 4,486,682

[45] Date of Patent: Dec. 4, 1984

[54] STRESS COMPENSATED QUARTZ RESONATOR HAVING ULTRA-LINEAR FREQUENCY-TEMPERATURE RESPONSE

[75] Inventors: Mitsuo Nakazawa, Matsushiro, Japan; Arthur Ballato, Long Branch; Theodore J. Lukaszek, Ocean, both of N.J.

[73] Assignee: The United States of America as represented by the Secretary of the Army, Washington, D.C.

[21] Appl. No.: 476,009

[22] Filed: Mar. 17, 1983

[51] Int. Cl.³ .................................. H01L 41/08
[52] U.S. Cl. .................................... 310/361
[58] Field of Search .............. 310/360, 361; 73/190 R

[56] References Cited

U.S. PATENT DOCUMENTS 4,313,071 1/1982 Hermann ........................... 310/361

OTHER PUBLICATIONS

Handbook of Piezoelectric Crystals for Radio Equipment Designers, by Buchanan, WADC Technical Report 54-248, Wright Air Developement Center, Dec. 1954, pp. 19 and 20.

Hewlett-Packard Journal, vol. 16, pp. 1-7, 1965, Hammond, et al.
Physical Acoustics, vol. 13, pp. 115-181, A. Ballato, 1977.
Proc. 35th Annual Frequency Control Symposium, B. Sinha, pp. 213-221, May, 1981.

Primary Examiner—Mark O. Budd
Attorney, Agent, or Firm—Anthony T. Lane; Jeremiah G. Murray; Edward Goldberg

[57] ABSTRACT

A new family of stress compensated quartz resonators having cuts exhibiting an ultra-linear frequency vs. temperature characteristic. This family of resonators has an orientation defined with respect to the crystallographic axes by polar angles $\phi$ and $\theta$, which angles lie on the locus where the second-order temperature coefficient of frequency is zero between the angles $\phi = 20° \pm 2°$ and $\theta = 20° \pm 5°$, and in close proximity to the locus of zero coefficient of stress. In one preferred embodiment, the resonator comprises a plate whose angles of cut $\phi$ and $\theta$ are both substantially equal to 20°. In a second preferred embodiment an exact stress compensation is provided where $\phi$ is substantially equal to 20.8° and $\theta$ is substantially equal to 23.2°, and orientation where the locus of the zero coefficient of stress intersects the locus of the zero of the second-order temperature coefficient.

7 Claims, 4 Drawing Figures

STRESS COMPENSATED QUARTZ RESONATOR HAVING ULTRA-LINEAR FREQUENCY-TEMPERATURE RESPONSE

The invention described herein may be manufactured and used by or for the Government for governmental purposes without the payment of any royalties thereon or therefor.

FIELD OF THE INVENTION

This invention relates generally to the field of piezoelectric resonators and more particularly to quartz crystal resonators which exhibit a linear change in frequency with respect to a change in temperature.

BACKGROUND OF THE INVENTION

The use of quartz resonators for sensing temperature is known and has generally involved the use of unrotated X- and Y-cut plates. In such devices, the output frequency (f) is a function of temperature (T) which can be expressed by the power series:

$$\Delta f/f_0 = (f-f_0)/f_0 = a(\Delta T) + b(\Delta T)^2 + c(\Delta T)^3, \quad (1)$$

where $\Delta T = T - T_0$, and $f_0$ is the reference frequency at a reference temperature $T_0$ which is normally taken as 25° C. The coefficients a, b and c are referred to as the temperature coefficients of frequency (TCF) of the first-, second- and third-order, respectively, and which are written as $TCF^{(1)}$, $TCF^{(2)}$ and $TCF^{(3)}$. Accordingly: $a = TCF^{(1)}$, $b = TCF^{(2)}$, $c = TCF^{(3)}$. The coefficient "a" comprises the linear term, whereas the coefficient "b" comprises the quadratic or parabolic term, and the coefficient "c" comprises the cubic or cubic parabolic term. Moreover, the units of these coefficients are normally expressed in $10^{-6}$ per kelvin(K), $10^{-9}/K^2$ and $10^{-12}/K^3$, respectively.

For unrotated X- and Y-cuts, not only is the $TCF^{(1)}$ coefficient relatively large, but the coefficients $TCF^{(2)}$ and $TCF^{(3)}$ are relatively large as well. While this is indicative of a resonator whose output frequency will be a function of its temperature, the relation between f and T will not be linear and as a result a special calibration is required when it is utilized. Moreover, the calibration is a function of time because of such factors as stress relaxation in the resonator electrodes and changes in the stresses occurring in the crystal mounting supports. These particular perturbations and others go under the collective name of "resonator aging". Additionally, temperature transients supplied to the resonator enclosure also lead to thermal gradients within the crystal and, as a result, produce large frequency excursions which are not predicted by the aforementioned power series since the formula defined by equation (1) governs quasi-static temperature changes.

In view of the inherent limitations existing in nonrotated X- and Y-cut quartz plates, a doubly rotated LC (linear coefficient) cut has been developed. As is well known, the LC cut resonator comprises a cut which is located at an orientation where second-order and third-order terms $TCF^{(2)}$, $TCF^{(3)}$ are equal and substantially equal to zero or at least negligible, while the first-order term $TCF^{(1)}$ is not zero. Such a cut exhibits a substantially linear frequency vs. temperature characteristic which can be expressed as:

$$\Delta f/f_0 = (f-f_0)/f_0 = a(T-T_0) = a(\Delta T). \quad (2)$$

The LC cut has not only been used but has been found to be commercially successful in thermometric sensing applications. One such application comprises a quartz thermometer apparatus.

While this type of resonator constituted a distinct advancement in the art, it nevertheless still suffers from certain other inherent limitations such as: the crystal is difficult to manufacture because the two orientation angles $\phi$ and $\theta$, polar angles of the spherical coordinate system $(0-s, \theta_0, \text{and } \phi_0)$, are such that the cut is not located near any X-ray planes of any reasonable strength, it is uncompensated for any in-plane stresses such as electrode stresses which lead to component aging; it is not compensated for thermal transients which lead to inaccurate frequency and hence temperature readout in the presence of thermal gradients; and, is not compensated against thermal hysteresis which leads to temperature ambiguities which are dependent upon the size and direction of the temperature excursions sensed by the resonator.

SUMMARY

Accordingly, it is an object of the present invention to provide an improvement in piezoelectric resonators.

It is another object of the present invention to provide an improvement in quartz crystal resonators which operate on a single odd harmonic or two odd harmonics simultaneously;

It is a further object of the present invention to provide an improvement in quartz crystal resonators which are sensitive to temperature.

It is yet another object of the present invention to provide an improvement in temperature sensitive quartz resonators which provide a frequency output which is extremely linear with respect to changes in temperature.

It is yet a further object of the present invention to provide a temperature sensitive resonator which is compensated against the effects of stress as well as thermal transients and hysteresis effects.

Briefly, these and other objects are accomplished by means of a stress compensated piezoelectric resonator having a doubly rotated cut whose orientation is defined in terms of the polar angles $\phi$ and $\theta$, which angles lie on a locus where the second-order temperature coefficient of frequency is zero and in the range of $\phi = 20° \pm 2°$ and $\theta = 20° \pm 5°$. These angles of orientation are, moreover, in close proximity to or on the locus of zero coefficient of stress. One preferred embodiment comprises the NL cut wherein $\phi$ is substantially equal to 20° and $\theta$ is substantially equal to 20°, while a second preferred embodiment comprises a NLSC cut where $\phi$ is substantially equal to 20.8° and $\theta$ is substantially equal to 23.2°, which exists at the intersection of the two loci thereby providing a cut which is exactly stress compensated.

DESCRIPTION OF THE PREFERRED EMBODIMENTS

Figure 1:
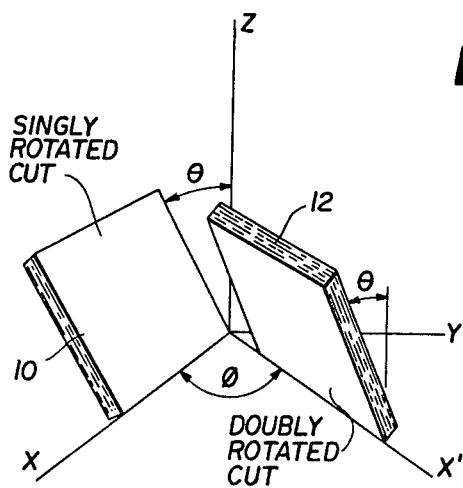
FIG. 1 is a diagram illustrative of singly rotated cut and doubly rotated cut quartz crystal resonator plates oriented in relation to their crystallographic axes.

Referring now to the drawings and more particularly to FIG. 1, shown thereat is a set of mutually perpendicular X, Y and Z axes which, as is well known, define the crystallographic axes of quartz crystal resonators according to a right-handed rectangular Cartesian coordinate system. The X axis represents the electrical axis, the Y axis represents the mechanical axis, and Z represents the optical axis. In FIG. 1, two relatively thin resonator plates 10 and 12 are shown for the purpose of illustrating the distinction between well known singly and doubly rotated cuts. The singly rotated cut resonator plate 10 has its major faces oriented at a polar angle $\theta$ with respect to the Z (optical) axis while the doubly rotated cut plate 12 includes not only the angle $\theta$ but also a second polar angle $\phi$ which is an angle in relation to the X (electrical) axis. Thus a doubly rotated cut quartz crystal resonator comprises a plate having crystallographic orientations which are a function of the two angles $\phi$ and $\theta$. The crystal plate orientations herein are in accordance with the known "Standards on Piezoelectric Crystals, 1949" published in the Proceedings of the I.R.E., December 1949, pages 1378-1395. Pages 1387-1390 define the "Rotational Symbols" wherein YX represents the initial orientation used in the present case, as shown in FIG. 1, and wherein the first letter Y represents the direction of plate thickness before rotation, and the second letter X is the direction of plate length before rotation, as exemplified by FIG. 14 of the standard. The angle $\phi$ then represents the direction of first rotation about the Z axes or width direction with respect to the X axis and the angle $\theta$ is the second rotation about the X axis or length direction with respect to the Z axis. The standard notation for the present doubly rotated crystal plate is thus (YXwl) $\phi/\theta$.

Figure 2:
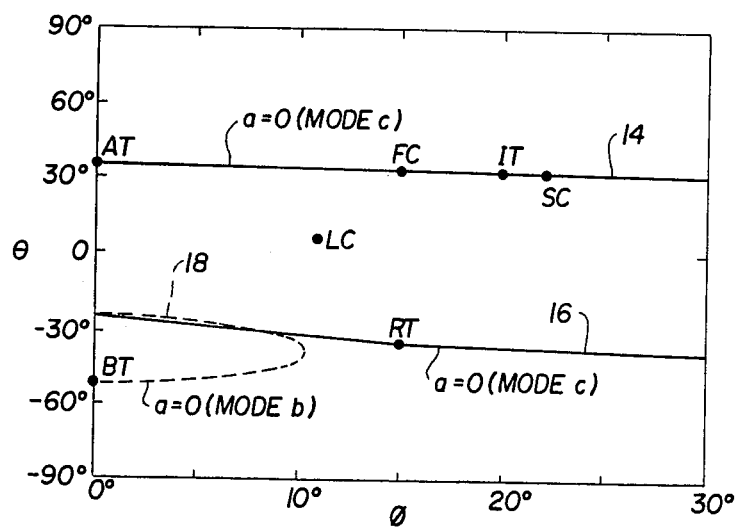
FIG. 2 is a graph illustrative of the loci for various cuts of quartz plate resonators where the first order termperature coefficients of frequency are zero.

Referring now to FIG. 2, there is a graphical illustration of several well known cuts of crystal resonators plotted in relation to their orientation angles $\phi$ and $\theta$. As indicated by the graph of FIG. 2, the AT and BT cuts comprise singly rotated cuts inasmuch as their angle $\phi$ is 0°, and correspond to the plate 10 of FIG. 1. As shown, the angle $\theta$ for these cuts is in the region of +35° and −50°, respectively. Cuts having a discrete value of angle $\phi$ and thus describing doubly rotated cuts comprise the cuts FC, IT, and SC, which have an angle $\theta$ in the region of +35° as well as LC and RT cuts which have an angle $\theta$ in the region of +10° and 35°, respectively.

As is well known, such resonators have three possible modes of operation, namely a longitudinal wave which is called an "a mode" and two transverse waves which are respectively called the "b mode" and the "c mode". All these modes are excited piezoelectrically. Moreover, the a mode is essentially a thickness-extensional vibration, while the b and c modes are thickness shear vibrations and thus comprise shear modes. Furthermore, the b mode comprises a shear mode which is relatively faster than the c mode. Moreover, the output frequency of a quartz resonator plate operating, for example, in the b or c mode is a function of temperature which can be expressed by the power series of equation (1) and includes the aforementioned first-, second- and third-order terms.

With further reference to FIG. 2, the curves indicated by reference numerals 14 and 16 represent the loci in quartz for plate resonators having the first-order coefficient $a = TCF^{(1)} = 0$ for the slower c mode while the dotted line 18 describes the locus for the faster shear mode (mode b). It can be seen that the AT, BT, IT and SC cuts are located on the locus 14, while the RT cut is located on the locus 16. The BT cut is located on the locus 18. Such cuts while being temperature sensitive, do not provide a linear response due to the existence of the second- and third-order terms, i.e. $TCF^{(2)} \neq 0$ and $TCF^{(3)} \neq 0$.

Figure 3:
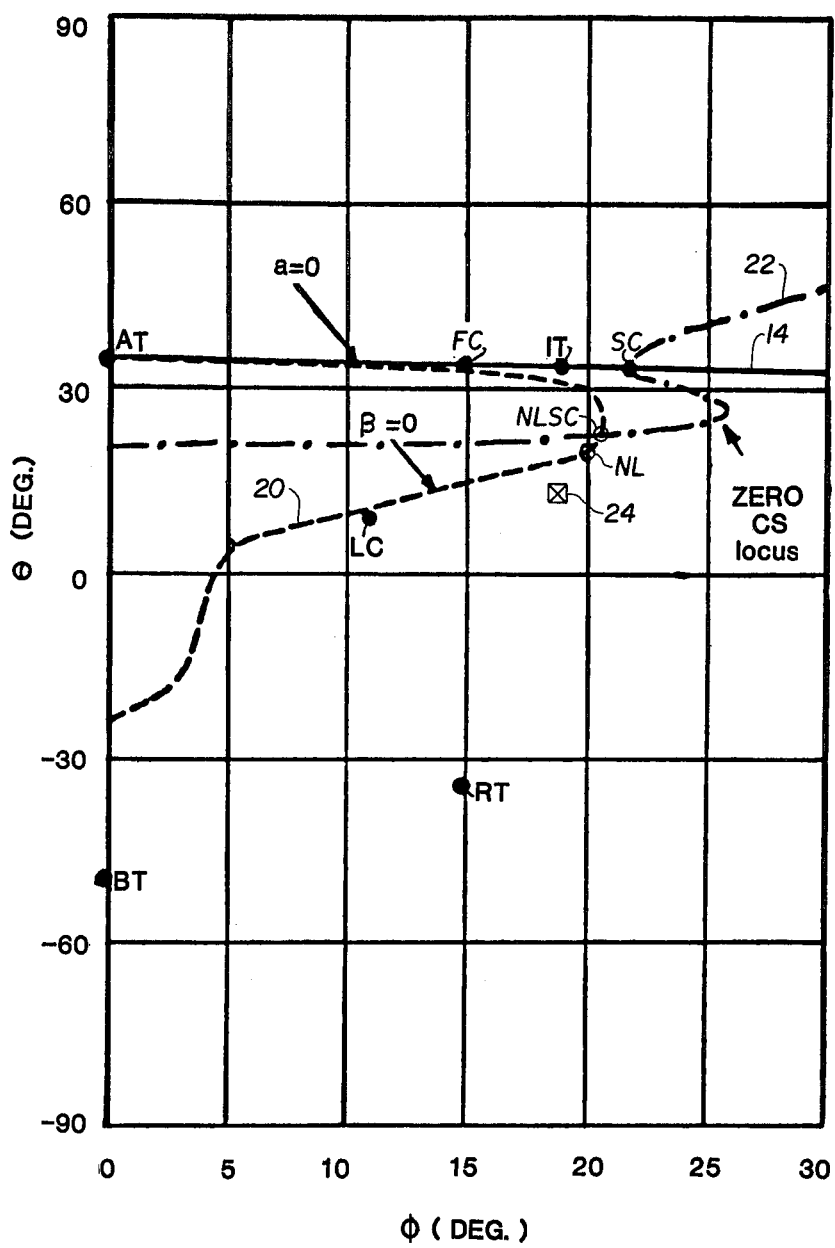
FIG. 3 is a graph illustrative of the family of doubly rotated cut quartz plate resonators in accordance with the subject invention.

The LC cut, however, is shown not to be located on any of the loci shown in FIG. 2. If, however, the locus of the zero $TCF^{(2)}$ coefficient is plotted in terms of the angles $\phi$ and $\theta$, a locus as represented by the line 20 shown in FIG. 3 results. Referring now to FIG. 3, this line passes sufficiently close to the $\phi$, $\theta$ point of the LC cut which is indicative of the fact that its second-order coefficient is substantially near the $TCF^{(2)} = 0$ locus to be substantially zero. Accordingly, any cut on or about the zero $TCF^{(2)}$ locus 20 will have its quadratic (parabolic) term equal to zero or nearly so and its frequency-temperature characteristic can be described by the expression:

$$\Delta f/f_0 = a(\Delta T) + c(\Delta T)^3 \quad (3)$$

In the event that the temperature excursion $\Delta T$ is not extremely large and/or the coefficient $c = TCF^{(3)}$ is not too large, the frequency change $\Delta f/f_0$ will be approximately linear. For the LC cut ($\phi = +11.2°$, $\theta = +9.4°$), the third-order coefficient $TCF^{(3)}$ has been found to be substantially zero and equation (3) is reduced to the desirable relationship of:

$$\Delta f/f_0 = a(\Delta T), \quad (4)$$

thus making its frequency linear with respect to changes in temperature.

With the foregoing in mind, the present invention is directed now to a new family of doubly rotated cuts having an orientation in the vicinity of $\phi = 20° \pm 2°$, $\theta = 20° \pm 5°$. The cut having an angle $\phi$ substantially equal to 20° and an angle $\theta$ substantially equal to 20° is referred to and is shown in FIG. 3 as the NL cut and lies on the $TCF^{(2)} = 0$ locus curve 20. It has been determined experimentally that cuts at or near the $\phi$, $\theta$ point of the NL cut exhibit a $TCF^{(3)}$ coefficient which is extremely small, making it practically negligible insofar as the frequency-temperature characteristic of equation (3) is concerned.

It has been further found that there are several distinguishable features which provide distinct improvements over the conventional LC cut described above. The most important new feature has to do with the phenomenon of stress compensation coupled with linear frequency response. Stress compensation refers to the insensitivity of resonator frequency in relation to changes in in-plane stresses of the major plate surface. Therefore, stresses produced by the electrodes that change with time to produce aging in conventional resonators, would not produce frequency changes in a stress compensated resonator. One such known resonator comprises the SC cut shown in FIG. 3; it lies on a locus of zero coefficient of stress which is indicated by the curve 22. However, it does not lie on the $TCF^{(2)} = 0$ locus line 20 denoting that its frequency response is nonlinear.

What is significant about the locus curve 22 is that it additionally passes in close proximity to the $\phi$, $\theta$ point of the NL cut. Furthermore, there is one particular orientation of cut close to the NL cut where the zero coefficient of stress locus curve 22 intersects the zero second-order coefficient locus 20. This point is where $\phi$ is substantially equal to 20.8° and $\theta$ is substantially equal to 23.2°. Such a cut called the NLSC or "NL stress-compensated" cut has an orientation which is compensated for both stress and parabolic or second-order frequency vs. temperature variation, with a precision heretofore unobtainable. All other NL family of cuts in the region between the angles $\phi=20°\pm2°$, $\theta=20°\pm5°$ are approximately stress compensated but all have zero second-order temperature coefficients TCF$^{(2)}$.

In addition to providing stress compensation, the NL family of cuts is substantially and in some instances exactly compensated for thermal transient effects and for thermal hysteresis effects inasmuch as the locus of zero thermal transient coefficient is virtually identical to that of the locus of zero stress compensation indicated by the curve 22. Moreover, a relatively strong 1, 2, $\bar{3}$1 X-ray plane has been found to exist at the quartz crystal orientation of $\phi$ substantially equal to 19.1° and $\theta$ substantially equal to $+16.6°$ and which is shown in FIG. 3 by reference numeral 24. It can be seen that this X-ray plane is in close proximity to the NL cut and its family of cuts, making the manufacture of these cuts considerably easier and cheaper than the LC cut.

Still another advantage is the magnitude of the capacitance ratio of the equivalent circuit of such resonators. For the LC cut the capacitance ratio is approximately 146 while for the NL cut the capacitance ratio is approximately 733. Thus the NL cut is considerably stiffer and less susceptible to circuit variations causing unwanted contributions to oscillator frequency.

Figure 4:
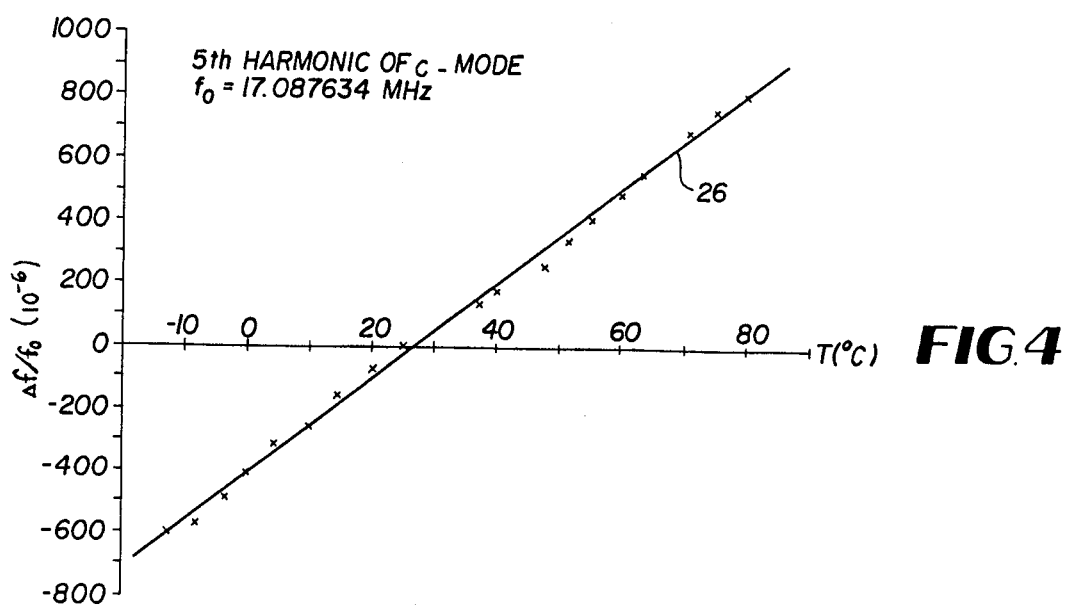
FIG. 4 is a graph illustrative of the frequency-temperature characteristic of a quartz resonator in accordance with the subject invention operating in a shear mode.

As an example of the linear relationship between frequency and temperature, for NL types of cuts, reference to FIG. 4 is illustrative of such a characteristic for an NL cut operating in the fifth harmonic of the c mode whose $f_0$ frequency is 17.087634MHz at room temperature. As evidenced by the graph 26 derived from a plurality of experimental data points, an ultra-linear frequency-temperature characteristic in comparison to known prior art devices is provided.

Thus, while the conventional LC cut provides a substantially linear frequency-temperature response, the NL family of cuts provide an even better frequency response and are substantially stress compensated and, in particular, the NLSC cut is stress compensated for with great precision. In addition to providing improved insensitivity to thermal gradients and hysteresis effects, the capacitance ratio of the NL cut is in the order of five times that for the LC cut, so that for a given frequency of operation, the reactance slope with frequency will be greater for the NL type of cut and hence will be less sensitive to environmental non-temperature and circuitry changes.

It should be noted that the above mentioned characteristic regarding capacitance ratio pertains to two resonators, one an NL cut and one an LC cut, operating on the same harmonic. By increasing the order of the harmonic (odd harmonics) the capacitance ratio is increased by the square of the harmonic number. The stress compensated property of the NL family of cuts and particularly the NLSC cut is independent of the harmonic whereas, for example, the LC cut is not so compensated, for any harmonic. Moreover, the NL family of cuts and particularly the NLSC cut, may be operated simultaneously on two or more differing odd harmonics, and the stress compensated property will still obtain simultaneously and independently for each harmonic. This property is extremely useful in applications that use simultaneous operation of a resonator at two or more harmonics while providing compensation against envoronmental conditions such as vibration, shock, etc.

Having thus shown and described what is considered to be the preferred embodiments of the invention, it should be understood that the foregoing has been made by way of illustration and not limitation. Accordingly, all modifications, alterations and changes coming within the spirit and scope of the invention as set forth in the appended claims are herein meant to be included.

We claim:

1. A piezoelectric resonator comprising a monolithic thin plate of piezoelectric material having a doubly rotated cut positioned at an orientation with respect to a standard rotational symbol YXwl ($\phi,\theta$) defined in terms of the X, Y, Z crystallographic axes and the major faces at polar angles $\phi$ and $\theta$, wherein thickness is in the Y direction, length in the X direction and width in the Z direction, and wherein $\phi$ is the direction of first rotation about the Z axis with respect to the X axis and $\theta$ is the direction of second rotation about the X axis with respect to the Z axis, where angle $\phi$ is in the range of $\phi=20°\pm2°$ C. and where angle $\theta$ is in the range of $\theta=20°\pm5°$ C. and are on a locus such that the second order temperature coefficient of frequency approximates zero and the coefficient of stress approximates zero.

2. The piezoelectric resonator as defined by claim 1 wherein said thin plate of piezoelectric material comprises a thin plate of quartz.

3. The piezoelectric resonator as defined by claim 2 wherein said angle $\phi$ is substantially equal to 20° and wherein said angle $\theta$ is substantially 20°.

4. The piezoelectric resonator as defined by claim 2 wherein said angle $\phi$ is substantially 20.8° and said angle $\theta$ is substantially 23.2°, an orientation where the locus of the zero coefficient of stress intersects the locus of the second order temperature coefficient and thus providing a resonator having a precise stress compensation.

5. A piezoelectric resonator comprising a thin plate of quartz operable at a predetermined harmonic and having a doubly rotated cut positioned at an orientation with respect to a standard rotational symbol YXwl ($\phi,\theta$) defined in terms of the X,Y,Z crystallographic axes and the major faces at polar angles of $\phi$ and $\theta$, wherein thickness is in the Y direction, length in the X direction and width in the Z direction, and wherein $\phi$ is the direction of first rotation about the Z axis with respect to the X axis and $\theta$ is the direction of second rotation about the X axis with respect to the Z axis, where $\phi$ is in the range of $\phi=20°\pm2°$ and $\theta$ is in the range of $\theta=20°\pm5°$, said angles being on a locus such that the second order temperature coefficient of frequency approximates zero and the coefficient of stress approximates zero.

6. The piezoelectric resonator as defined by claim 5 wherein said thin plate of quartz is operable at a predetermined odd harmonic.

7. The piezoelectric resonator as defined by claim 5 wherin said thin plate of quartz is operable at two harmonics simultaneously.

* * * * *